United States Patent [19]

Davis

[11] 4,250,455
[45] Feb. 10, 1981

[54] SQUARE WAVE/SINE WAVE CONVERSION

[75] Inventor: Bryce D. Davis, Sackville, Canada

[73] Assignee: Her Majesty the Queen in right of Canada, Ottawa, Canada

[21] Appl. No.: 936,801

[22] Filed: Aug. 25, 1978

[30] Foreign Application Priority Data

Nov. 2, 1977 [CA] Canada .................................. 290049

[51] Int. Cl.³ ............................................. H03B 1/00
[52] U.S. Cl. .................................. 328/167; 307/261; 307/295; 328/27
[58] Field of Search ................ 330/107, 109; 307/261, 307/295; 328/27, 167

[56] References Cited

U.S. PATENT DOCUMENTS

| 3,549,903 | 12/1970 | Lowdenslager | 328/127 |
| 3,760,289 | 9/1973 | Hurtig | 328/167 |
| 3,845,398 | 10/1974 | Katz | 328/128 |
| 4,063,450 | 12/1977 | Lyons | 328/167 |

Primary Examiner—Harold A. Dixon
Attorney, Agent, or Firm—Stevens, Davis, Miller & Mosher

[57] ABSTRACT

A square wave to sine wave converter using a low-pass filter. The cut-off frequency of the filter is variable in accordance with the frequency of the square wave applied to it. This is achieved by the effective value of a frequency-determining impedance in the filter varying with the square wave frequency. A resistor is switched in and out of circuit at a rate which is at least a multiple of 100 of the square wave frequency.

4 Claims, 1 Drawing Figure

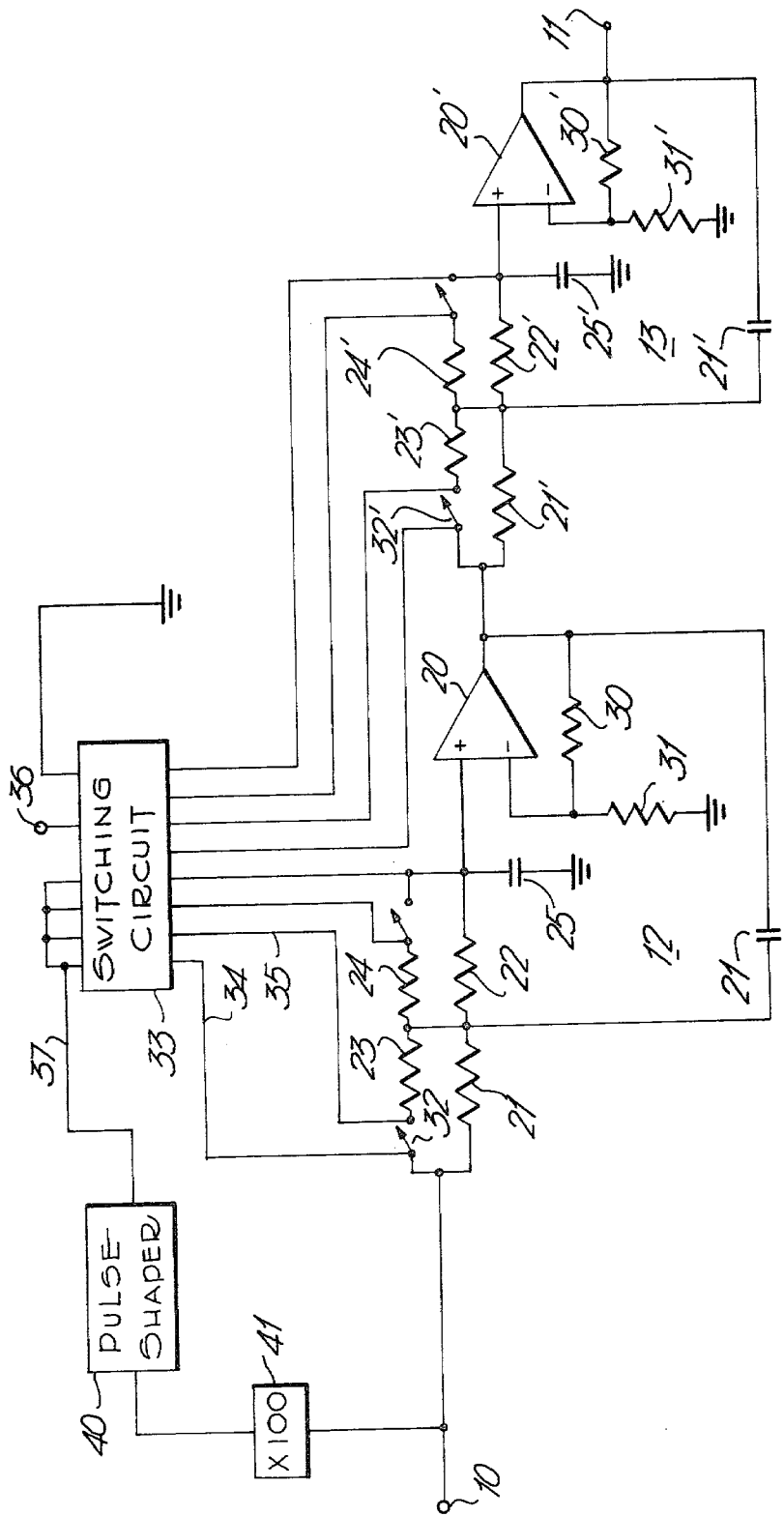

SQUARE WAVE/SINE WAVE CONVERSION

The present invention relates to a square wave to sine wave converter operable over a broad band of frequencies.

Generally, square wave to sine wave converters consist of some arrangement of low pass filters. Where the square wave is of variable frequency, it is known to provide a bank of low pass filters with a range of cut-off frequencies. The required filter for each frequency is selected by mechanical switching or computer control.

The present invention provides a converter of reduced complexity, size and cost. The square wave to sine wave converter at this invention includes a low-pass filter connected between the input terminal and the output terminal, the filter including a frequency-determining impedance controlling the cut-off frequency. Switching means are connected to the frequency-determining impedance for modifying the value thereof. Generating means are connected between the input terminal and the switching means for actuating the switching means at a frequency higher than that of the square wave.

The invention will be apparent from the following description of a preferred embodiment taken in conjunction with the accompanying drawing which is a schematic circuit diagram of a square wave to sine wave converter.

DESCRIPTION OF THE PREFERRED EMBODIMENT

The square wave to sine wave converter is adapted to receive a square wave at terminal 10 and provide the corresponding sine wave at terminal 11. Two identical low-pass filters 12 and 13 are connected between terminals 10 and 11. In describing the filters identical reference numerals will be used, those of filter 13 being distinguished by a prime.

Each filter is of the active feedback type having an operational amplifier 20 with feedback via capacitor 21 to the network formed by resistors 21, 22, 23 and 24. The amplifier input is shunted by capacitor 25, generally chosen equal in value to capacitor 21. The net gain of the filter is determined by the feedback network formed by resistors 30 and 31.

Resistors 21 and 23, for example, form a composite resistor element in which resistor 21 is in parallel with a series arrangement of resistor 23 and a switch. The single figure of the drawing shows a switch 32 but this is diagrammatic for the purposes of explanation and it will be understood that the switch is located in a switching circuit 33 and appropriately connected to the composite resistor element by leads 34 and 35. In practice, switching circuit 33 can be a CD 4016 analog switch having an input on lead 37, energised at terminal 36 and having further pairs of leads to the composite resistor elements 22, 24; 21', 23' and 22', 24'.

Switching circuit 33 is controlled by a train of narrow pulses produced by pulse shaper 40 in turn supplied from a frequency multiplying circuit 41. Typically the pulse train produced on lead 37 has pulses of 1.8 $\mu$secs duration at a frequency of one hundred times the frequency of the square wave applied to terminal 10.

In operation, the cut-off frequency of the filters 12 and 13 tracks with the frequency of the square wave signal supplied at terminal 10 to provide sufficient filtering action to produce a sine wave of the same frequency at terminal 11. Each composite resistive element assumes an average value dependent on the rate of switching and the values of the resistors. It has been found that a frequency multiplying factor of 100 in circuit 41 avoids any significant amount of switching noise appearing at output terminal 11.

A circuit constructed with the following component values has given satisfactory performance over the frequency range 10 $H_z$–2500 $H_z$:
Resistors 23, 24–1 k$\Omega$
Resistors 21, 22–1 M$\Omega$
Capacitors 21, 25–0.068 $\mu$f.
Amplifiers 20, 20'–Lm 318

Thus a simple circuit has been described which provides square wave to sine wave conversion over a broad band of frequencies. It will be clear that the principles are applicable to other types of filter network. If switching circuit 33 is controlled by an external frequency source, independent control of filter cut-off frequencies can be obtained.

The embodiments of the invention in which an exclusive property or privilege is claimed are defined as follows:

1. A square wave to sine wave converter having an input terminal adapted to receive a square wave at an input frequency and an output terminal adapted to provide a sine wave at an output frequency, comprising:
   a low pass filter connected between the input terminal and the output terminal, said low pass filter including an impedance whose effective value is determined by the input frequency of the square wave, the effective value of the impedance subsequently determining a cut-off frequency for said low pass filter;
   switching means connected to said impedance for modifying the value thereof, said switching means including a switch and said impedance in parallel with a series arrangement of a resistor and said switch; and
   generating means connected between the input terminal and the switching means, said generating means being operable to produce a train of narrow pulses for actuating said switch at a rate equal to a multiple of the input frequency of said square wave.

2. A square wave to sine wave converter, comprising:
   at least one low-pass filter connected in series to receive a square wave and produce a corresponding sine wave, each filter having a pair of composite resistor elements to determine the cut-off frequency;
   frequency multiplying means adapted to receive the square wave and provide a signal at a multiple of the frequency thereof;
   pulse shaping means responding to the aforesaid signal and producing a train of narrow pulses in synchronism therewith; and
   a switching circuit containing a plurality of switches each actuated in response to the occurrence of a pulse in said train of narrow pulses
   each composite resistor element consisting of a first resistor in parallel with a series arrangement of a second resistor and one of said plurality of switches whereby the cut-off frequency of each filter varies with the frequency of the received square wave.

3. A converter as defined in claim 2 wherein each said low-pass filter is an active feedback low-pass filter.

4. A square wave to sine wave converter, comprising:

a pair of active feedback low-pass filters connected in series to receive a square wave and produce a corresponding wave, each filter having a pair of composite resistor elements to determine the cut-off frequency.

frequency multiplying means adapted to receive the square wave and provide a signal at a multiple of the frequency thereof, pulse generating means responsive to said signal to produce a train of narrow pulses in synchronism therewith, a switching circuit containing a plurality of switches each actuated in response to the occurrence of a pulse in said train of narrow pulses, each composite resistor element consisting of a first resistor in parallel with a series arrangement of a second resistor and one of said plurality of switches whereby the cut-off frequency of each filter varies with the frequency of the received square wave.

* * * * *